(12) United States Patent
Ueda et al.

(10) Patent No.: US 8,334,215 B2
(45) Date of Patent: Dec. 18, 2012

(54) SUBSTRATE PROCESSING METHOD AND SUBSTRATE PROCESSING APPARATUS

(75) Inventors: Tatsushi Ueda, Toyama (JP); Tadashi Terasaki, Imizu (JP); Unryu Ogawa, Toyama (JP); Akito Hirano, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 894 days.

(21) Appl. No.: 12/320,767

(22) Filed: Feb. 4, 2009

(65) Prior Publication Data

US 2009/0169768 A1 Jul. 2, 2009

Related U.S. Application Data

(62) Division of application No. 11/886,529, filed as application No. PCT/JP2006/304960 on Mar. 14, 2006, now Pat. No. 8,066,994.

(30) Foreign Application Priority Data

Mar. 16, 2005 (JP) ................................. 2005-075917
Jul. 27, 2005 (JP) ................................. 2005-216666

(51) Int. Cl.
H01L 21/302 (2006.01)

(52) U.S. Cl. .... 438/720; 438/714; 438/770; 156/345.33

(58) Field of Classification Search .................. 438/706, 438/710, 712, 714, 720, 770, 773; 216/58, 216/64, 67; 156/345.33, 34
See application file for complete search history.

(56) References Cited

U.S. PATENT DOCUMENTS

| | | | |
|---|---|---|---|
| 6,500,742 B1* | 12/2002 | Chern et al. | 438/582 |
| 6,635,185 B2 | 10/2003 | Demmin et al. | |
| 6,834,656 B2 | 12/2004 | Qingyuan et al. | |
| 2002/0197402 A1 | 12/2002 | Chiang et al. | |
| 2004/0137755 A1* | 7/2004 | Herring et al. | 438/770 |
| 2004/0245584 A1 | 12/2004 | Murakawa et al. | |
| 2005/0009281 A1* | 1/2005 | Lim et al. | 438/287 |
| 2006/0110900 A1* | 5/2006 | Youn et al. | 438/592 |

FOREIGN PATENT DOCUMENTS

| | | |
|---|---|---|
| JP | A 8-102534 | 4/1996 |
| JP | A 2000-150479 | 5/2000 |
| JP | A-2000-332245 | 11/2000 |
| JP | A 2000-332245 | 11/2000 |
| JP | A 2003-068731 | 3/2003 |
| JP | A 2003-163213 | 6/2003 |
| WO | WO 2004/073073 A1 | 8/2004 |

OTHER PUBLICATIONS

English-language translation of Office Action issued in corresponding Japanese Application No. 2007-508141, issued Jun. 1, 2010.
Jan. 5, 2011 Office Action issued in U.S. Appl. No. 11/886,529.
Japanese Office Action issued on Nov. 29, 2011 in Japanese Application No. 2009-061425 (with translation).

* cited by examiner

*Primary Examiner* — Lan Vinh
(74) *Attorney, Agent, or Firm* — Oliff & Berridge, PLC.

(57) ABSTRACT

A substrate can be appropriately oxidized, while oxidation of the substrate can be suppressed. The present invention includes a step of generating mixed plasma by causing a mixed gas of hydrogen (H2) gas and oxygen(O2) or oxygen/containing gas supplied to a processing chamber to form a plasma discharge, and processing the starting substrate by the mixed plasma; and a step of generating hydrogen plasma by causing hydrogen (H2) gas supplied to the processing chamber to form a plasma discharge, and processing the substrate by the hydrogen plasma.

15 Claims, 7 Drawing Sheets

SUBSTRATE PROCESSING METHOD AND SUBSTRATE PROCESSING APPARATUS

This application is a divisional of U.S. patent application Ser. No. 11/886,529 now U.S. Pat. No. 8,066,994, filed Jan. 11, 2008, which is a National Phase of Application No. PCT/JP2006/304960, filed Mar. 14, 2006, which claims priority to Japanese Patent Application No. 2005-075917, filed Mar. 16, 2005, and Japanese Patent Application No. 2005-216666, filed July. 27, 2005, the entire contents of which are hereby incorporated by reference.

TECHNICAL FIELD

The present invention relates to a substrate processing method and a substrate processing apparatus wherein a substrate is processed using plasma.

BACKGROUND ART

A semiconductor device that has a multilayer wiring structure is manufactured by repeatedly subjecting the surface of a silicon substrate or another such semiconductor wafer to film forming and pattern etching. For example, a floating gate layer, a control gate layer, and a control gate electrode layer are layered on the silicon substrate from the bottom layer up in a device known as a flash memory, and this layered film is patterned, thereby constructing a gate structure.

For the layered film, polysilicon, for example, is used for the floating gate electrode layer, and tungsten (hereinafter W), for example, or another such metal material and compounds thereof are used for the control gate electrode layer. These films are typically formed by CVD (Chemical Vapor Deposition), sputtering, or another such method. The film is patterned by using dry etching and physically shaving the surface of the layered film.

However, as this gate structure is reduced in thickness and size, the leakage currents between the layers become impossible to ignore. It has also become impossible to ignore leakage currents from side walls that accompany the miniaturization of the components. In the gate structure of a flash memory, the side wall portion is the most likely to have leakage currents, and the edge portions in particular are likely to leak due to electric field concentration. If the side walls are oxidized and the leakage currents can be reduced, the properties of the components are improved, but conversely, when the control gate electrode that uses metal elements is oxidized, the resistivity of the gate electrode portion increases, and needle-shaped crystals known as whiskers penetrate the adjacent film and grow, damaging the apparatus and leading to an unavoidable loss in component properties and yield rate. Also, the exposed metal portion simultaneously sublimates in the atmosphere during the substrate processing and adheres to the processing container or the substrate, causing unacceptable metal contamination to occur.

These problems would be resolved if the W could be replaced with an oxidation-resistant material, but a suitable material has not yet been found. Therefore, another way to resolve these problems is to find a method for oxidizing only the side walls of the polysilicon constituting the floating gate, without oxidizing the W used as the control gate electrode. Specifically, there is a need for a selective oxidation technique that would be able to selectively oxidize the silicon alone.

In view of this, a method that has been considered in conventional practice as a selective oxidation process is a method for selectively oxidizing only the silicon by using plasma that is a mixture of hydrogen gas and oxygen gas instead of moisture. An example of this conventional selective oxidation method will be described using FIG. 7. After a substrate has been conveyed into a processing chamber, the temperature of the substrate is raised to a specific processing temperature (substrate temperature increase), and a mixed gas (H2+O2 gas) containing hydrogen gas (H2 gas) and oxygen gas (O2 gas) is fed into the processing chamber while the pressure in the processing chamber is adjusted to a specific pressure (pressure adjustment). When the pressure in the processing chamber has stabilized, plasma discharge is initiated (discharge initiation), and the discharge is continued. This discharge creates H2+O2 mixed plasma, and this mixed plasma selectively oxidizes the side walls of the gate structure formed on the substrate surface (substrate processing).

The supply of mixed gas and the discharge are both stopped (discharge stopping), and the processing chamber is brought to the same pressure (approximately 100 Pa) as a vacuum transportation chamber (substrate conveying-out preparation) in order to convey the substrate from the processing chamber. Thus, an attempt is made to selectively oxidize only the silicon by using mixed plasma containing H2 gas and O2 gas.

As a relevant technique, in the step of creating the silicon oxide film, Ar is first introduced in order to prevent initial increased oxidation because Ar has the property of being easily discharged, and then oxygen is introduced and the oxygen radicals are activated (for example, see Patent Document 1). Another technique is to clean with hydrogen in order to remove the naturally oxidized film (for example, see Patent Document 2). Furthermore, another technique is to perform selective oxidation by reducing the tungsten (W) (for example, see Patent Document 3).

Patent Document 1: JP-A 2003-163213
Patent Document 2: JP-A 2000-150479
Patent Document 3: JP-A 8-102534

DISCLOSURE OF THE INVENTION

Problems which the Invention is Intended to Solve

However, in conventional methods for oxidizing a substrate by using a mixed gas of hydrogen and oxygen, hydrogen gas and oxygen gas are supplied simultaneously to the processing chamber, and these mixed gases are made to form a plasma discharge. Therefore, the oxygen gas is rapidly excited and the substrate is rapidly oxidized, causing a problem whereby the surface of the starting substrate becomes rough. For example, in cases in which the surface of the substrate is a metal, the metal is oxidized by the rapid excitation of the oxygen gas, and the metal surface sometimes becomes rough.

At the end of the oxidation process of the substrate by the mixed gas of hydrogen gas and oxygen gas, when the supply of hydrogen gas and oxygen gas is simultaneously halted to stop plasma discharge, it is clear that contamination has occurred and that the processing container has been contaminated. For example, in cases in which the metal is exposed on the substrate, the metal is also oxidized in no small amount and the oxidized metal is sublimated, resulting in metal contamination. Therefore, after a certain number of substrates have been processed, contaminant matter adhering to the inside of the processing container must be cleaned out, leading to the problem of reduced throughput.

An object of the present invention is to provide a substrate processing method and a substrate processing apparatus wherein a substrate can be oxidized to an appropriate degree, while the oxidation of the substrate can still be inhibited.

Another object of the present invention is to provide a substrate processing method and a substrate processing apparatus wherein oxidation of the substrate is inhibited and there is little surface roughness.

Yet another object of the present invention is to provide a substrate processing method and a substrate processing apparatus wherein throughput can be improved by reducing the contamination that occurs at the end of the substrate oxidation.

Means for Solving these Problems

The present invention provides a substrate processing method including a step of generating mixed plasma by causing a mixed gas of hydrogen gas and oxygen or oxygen-containing gas supplied to a processing chamber to form a plasma discharge, and processing the substrate by the mixed plasma; and a step of generating hydrogen plasma by causing hydrogen gas supplied to the processing chamber to form a plasma discharge, and processing the starting substrate by the hydrogen plasma.

Effects of the Invention

According to the present invention, in the step of processing with mixed plasma, the substrate can be oxidized to an appropriate degree because the substrate is processed by mixed plasma containing hydrogen gas and oxygen or oxygen-containing gas. In the step of processing with hydrogen plasma, oxidation of the substrate can be inhibited because the substrate is processed by hydrogen plasma.

BEST MODE FOR CARRYING OUT THE INVENTION

The embodiments of the present invention are described hereinbelow. The plasma processing furnace of the present invention is a substrate processing furnace (hereinafter referred to as an MMT apparatus) for processing wafers and other such substrates with plasma by using a modified magnetron plasma source, which is capable of generating high-density plasma with the aid of an electric field and a magnetic field. In this MMT apparatus, a substrate is placed in a processing chamber that is kept airtight, reaction gas is introduced into the processing chamber via a showerhead, the processing chamber is kept at a constant pressure, high-frequency voltage is supplied to a discharge electrode to form an electric field and a magnetic field, and a magnetron discharge is induced. Electrons emitted from the discharge electrode continue circling in a cycloid movement while drifting to provide longevity and an increased ionization rate, and high-density plasma can therefore be created.

Thus, the reaction gas is excited and decomposed to subject the substrate surface to oxidization, nitridation, or another such diffusion treatment; or to form a thin film on the substrate surface, to etch the substrate surface, or to subject the substrate to various other plasma processes.

FIG. 6 shows a schematic structural diagram of this type of MMT apparatus. The MMT apparatus has a processing container 203, and this processing container 203 is formed from a dome-shaped top container 210 as a first container, and a bowl-shaped bottom container 211 as a second container, wherein the top container 210 covers the top of the bottom container 211. The top container 210 is formed either from aluminum oxide or from quartz or another such non-metal material, and the bottom container 211 is formed from aluminum. A susceptor 217, which is a substrate holding tool (substrate holder) integrated with a heater, described later, is configured from aluminum or a non-metal material such as ceramics, or quartz, thereby reducing the metal contaminants that penetrate into the film during processing.

A showerhead 236 is provided at the top of a processing chamber 201, and includes a cap-shaped lid 233, a gas inlet port 234, a buffer chamber 237, an opening 238, a shielding plate 240, and a gas blowing port 239. The buffer chamber 237 is provided as a dispersion space for dispersing gas introduced through the gas inlet port 234.

A gas supply tube 232 for supplying gas is connected to the gas inlet port 234, and the gas supply tube 232 is joined to a gas cylinder of reaction gas 230 (not shown) via a valve 243a as an on-off valve, and a mass flow controller 241 as a flow rate control device (flow rate controller). The reaction gas 230 is supplied from the showerhead 236 to the processing chamber 201, and a gas exhaust port 235 is provided for exhausting gas to the side walls of the bottom container 211 so that the gas will flow from the periphery of the susceptor 217 towards the bottom of the processing chamber 201 after the substrate has been processed. A gas exhaust tube 231 for exhausting gas is connected to the gas exhaust port 235, and the gas exhaust tube 231 is connected to a vacuum pump 246, which is an exhaust device, via an APC 242 as a pressure adjusting device and a valve 243b as an on-off valve.

A cylindrical electrode 215, which is a first electrode formed in a tubular shape, e.g., a cylindrical shape, is provided as a discharge mechanism (discharge part) for exciting the supplied reaction gas 230. The cylindrical electrode 215 is provided around the outer periphery of the processing container 203 (the top container 210) and encloses a plasma generating area 224 inside the processing chamber 201. A high-frequency power source 273 is connected to the cylindrical electrode 215, and this high-frequency power source applies high-frequency voltage via a matching box 272 for matching impedance.

Cylindrical magnets 216, which are magnetic field-forming mechanisms (magnetic field-forming part) formed in a tubular shape, e.g., a cylindrical shape, act as cylindrical permanent magnets. The cylindrical magnets 216 are disposed in the vicinity of the top and bottom ends of the outer surface of the cylindrical electrode 215. The upper and lower cylindrical magnets 216, 216 have magnetic poles at both ends (the internal peripheral ends and the external peripheral ends) along the radial direction of the processing chamber 201, and the magnetic poles of the upper and lower cylindrical magnets 216, 216 are inversely polarized. Therefore, the magnetic poles on the internal periphery are heteropolar, thereby forming a line of magnetic force in the axial direction of the cylinder along the internal peripheral surface of the cylindrical electrode 215.

A susceptor 217 as a substrate holding tool (substrate holding mean) for holding a wafer 200 as a substrate is disposed in the center of the bottom of the processing chamber 201. The susceptor 217 is formed from, e.g., aluminum nitride or a non-metal material such as ceramics or quartz, and a heater (not shown) as a heating mechanism (heater) is integrally embedded in the interior, making it possible to heat the wafer 200. The heater can heat the wafer 200 to a temperature of 700 to 800° C. when supplied with electric power.

A second electrode as an electrode for varying the impedance is also installed in the susceptor 217, and this second electrode is grounded via an impedance variation mechanism 274. The impedance variation mechanism 274 is configured from a coil or a variable capacitor, and the electric potential of the wafer 200 can be controlled via the aforementioned electrodes and the susceptor 217 by controlling the number of coil patterns or the capacitance value of the variable capacitor.

A processing furnace 202, which is used to process the wafer 200 by magnetron discharge in the magnetron plasma source, is configured at least from the processing chamber 201, the processing container 203, the susceptor 217, the cylindrical electrode 215, the cylindrical magnets 216, the showerhead 236, and the gas exhaust port 235; and allows the wafer 200 to be processed with a plasma in the processing chamber 201.

A shielding plate 223 is provided around the periphery of the cylindrical electrode 215 and the cylindrical magnets 216 to effectively shield the electric field and the magnetic field, so that the electric field and magnetic field formed by the cylindrical electrode 215 and the cylindrical magnets 216 do not adversely affect the external environment, other processing furnaces, or other such devices.

The susceptor 217 is insulated from the bottom container 211, and is provided with a susceptor elevating/lowering mechanism (elevating/lowering part) 268 for raising and lowering the susceptor 217. Through-holes 217a are also provided in the susceptor 217, and wafer upthrust pins 266 for thrusting up the wafer 200 are provided in at least three locations in the bottom surface of the bottom container 211. The through-holes 217a and the wafer upthrust pins 266 are disposed so as to have a positional relationship in which the wafer upthrust pins 266 pass through the through-holes 217a without coming into contact with the susceptor 217 when the susceptor elevating/lowering mechanism 268 lowers the susceptor 217.

A gate valve 244 that acts as a sluice valve is provided in the side wall of the bottom container 211. When this valve is open, the wafer 200 can be conveyed into or out of the processing chamber 201 by a conveying mechanism (conveyor) (not shown), and when the valve is closed, the processing chamber 201 can be hermetically sealed.

A controller 121 as controller is configured to control the APC 242, the valve 243b, and the vacuum pump 246 through a signal wire A; to control the susceptor elevating/lowering mechanism 268 through a signal wire B; to control the gate valve 244 through a signal wire C; to control an integrator 272 and the high-frequency power source 273 through a signal wire D; to control the mass flow controller 241 and the valve 243a through a signal wire E; and to control the impedance variation mechanism 274 and the heater embedded in the susceptor through another signal wire (not shown).

Next, the substrate processing method of Embodiment 1 will be described using the gas flow and discharge sequence shown in FIG. 1. This substrate processing method uses a processing furnace having a configuration such as the one described above, wherein the step of manufacturing a semiconductor device is one step, and specific plasma processing is performed on the wafer 200 surface, or on the surface of a base film formed on the wafer 200.

Following is a description of a case of selectively oxidizing a wafer surface (device surface) having a configuration in which a polysilicon film and a metal film, e.g., tungsten (W), are exposed. This type of configuration is typified by a gate structure of a flash device. The gate structure of a flash device is created, for example, by sequentially layering over a silicon substrate a tunnel gate oxide film, a floating electrode composed of a polysilicon layer, an interpolysilicon layer having an ONO (oxide film-nitride film-oxide film) structure, and a control electrode composed of a two-layer structure that has a polysilicon layer and a W layer.

In the following description, the controller 121 controls the operations of the components constituting the substrate processing apparatus.

Substrate Conveying-in Step

The wafer 200 is conveyed into the processing chamber 201 by a conveying mechanism (not shown) for conveying wafers from the exterior of the processing chamber 201 constituting the processing furnace 202, and the wafer is placed on the susceptor 217. The details of this conveying operation are as follows. The susceptor 217 is lowered to a substrate conveying position, and the distal ends of the wafer upthrust pins 266 pass through the through-holes 217a in the susceptor 217. At this time, the wafer upthrust pins 266 protrude upward a specific height from the surface of the susceptor 217.

Next, the gate valve 244 provided to the bottom container 211 opens, and the conveying mechanism (not shown) places the wafer 200 on the distal ends of the wafer upthrust pins 266. When the conveying mechanism retracts to the outside of the processing chamber 201, the gate valve 244 closes. When the susceptor 217 is raised by the susceptor elevating/lowering mechanism 268, the wafer 200 can be placed on the top surface of the susceptor 217, and the wafer 200 can be raised to a position for processing.

Step of Raising Substrate Temperature

The heater embedded in the susceptor 217 is heated in advance, and the conveyed-in wafer 200 is heated to a specific wafer processing temperature that ranges from room temperature to 700° C. The vacuum pump 246 and the APC 242 are used to keep the pressure of the processing chamber 201 at a specific level within a range of 0.1 to 266 Pa.

Pressure Adjustment Step (Hydrogen ($H_2$) Gas Preliminary Introduction Step)

Once the wafer 200 has been heated to the processing temperature, hydrogen is supplied by introducing $H_2$ gas from the gas inlet port 234 via the gas blowing port 239 of the shielding plate 240, and the gas is introduced in the form of a shower onto the surface (processing surface) of the wafer 200 disposed in the processing chamber 201 ($H_2$ gas preliminary introduction step). At this time, the amount of $H_2$ gas flow is in the range of 100 to 1000 sccm. The vacuum pump 246 and the APC 242 are used to adjust the atmospheric pressure in the processing chamber 201 to a range of 0.1 to 266 Pa.

The reason the lower limit of the range of the $H_2$ gas flow rate is 100 sccm is because this flow rate is necessary for pressure adjustment. The reason the upper limit of the $H_2$ gas flow rate is 1000 sccm is because this is the limit of the supply conduit, and a greater gas flow rate may be used if possible. The reason the lower limit of the pressure range is 0.1 Pa is because this is the lower limit of low-pressure control. The reason the upper limit of the pressure range is 266 Pa is because if the pressure is any higher, the rate of film formation is reduced, which is undesirable.

The $H_2$ gas supplied in the pressure adjustment step is supplied continuously in a first step, a second step, a third step, and a fourth step, which are described later.

Hydrogen Plasma Discharge Step (First Step)

When the pressure in the processing chamber 201 has stabilized, high-frequency voltage is applied to the cylindrical electrode 215 from the high-frequency power source 273 via the integrator 272 to induce a plasma discharge, and this discharge is continued (discharge after the initiation of discharge). The applied high-frequency voltage has an output value within a range of about 100 to 500 W. At this time, the impedance variation mechanism 274 is controlled in advance to a desired impedance value. Since the atmosphere in the processing chamber 201 contains only $H_2$, the application of high-frequency voltage causes hydrogen plasma to be generated in the processing chamber 201. The hydrogen plasma contains H⁺ (hydrogen ions), H* (hydrogen radicals), and the like. Since the H⁺ and H* create a reducing atmosphere, this atmosphere suppresses the oxidation of the W surface exposed on the wafer 200.

It is believed that oxygen gas ($O_2$ gas) remains in the gas of the first step as a result of the preliminary wafer processing, but it is also believed that the amount is not sufficient to cause roughness in the W surface. The oxygen concentration is enough to sufficiently suppress oxidation if the processing container is evacuated for about 30 seconds, for example, and is preferably 12% or less. Particularly, the oxygen/hydrogen ratio is preferably 8:1, and the hydrogen concentration is preferably 11.1%.

Plasma discharge is performed continuously in the second step, which follows the first step.

Substrate Processing Step (Second Step)

After a specific amount of time, e.g., 3 to 5 seconds, or preferably about 5 seconds, has passed since the start of plasma discharge, $O_2$ gas begins to be introduced from the gas inlet port 234 via the gas blowing port 239 of the shielding plate 240, and the gas flow contains a mixed gas of $H_2$ gas and $O_2$ gas. The aforementioned specific time should be short because of considerations related to throughput, but a time of about 3 to 5 seconds is necessary until the plasma discharge can be stably controlled.

The introduction of $O_2$ gas into the processing chamber 201 is designed to ensure that the plasma discharge gradually adds $O_2$ to the $H_2$ gas atmosphere. In FIG. 1, the border between the preliminary $H_2$ gas and the following ($H_2+O_2$) gas is indicated as a slant. The reason $O_2$ gas is gradually added herein is to prevent more rapid plasma excitation of the $O_2$ due to discharge, and to more reliably prevent rapid oxidation from occurring on the surface of the wafer.

In the MMT apparatus of this embodiment, the $H_2$ gas and $O_2$ gas are mixed inside the gas supply tube 232, and are controlled so that the flow ratio of $O_2:H_2$ is ultimately about 1:8. The reason that the $O_2:H_2$ flow ratio is rich in hydrogen at 1:9 is because if the flow ratio is any higher (if the percentage of $O_2$ is any greater), selective oxidation between the W and the polysilicon is no longer possible.

It is generally preferable for the $H_2$ percentage to increase because reduction increases accordingly and oxidation of the W surface is further suppressed, but it is also not preferable because the oxidation rate of the polysilicon surface is conversely reduced. Therefore, if the reduction in the oxidation rate is within an acceptable range, the flow ratio is preferably less than 1:8 (the $H_2$ percentage is increased).

However, an MMT apparatus in particular has the superior characteristics in that the oxidation rate is not reduced even when the $O_2:H_2$ flow ratio is reduced (even when the percentage of $H_2$ is increased), in contrast to a common plasma apparatus. The MMT apparatus is therefore suitable as the oxidation processing apparatus of the present invention.

As a result of introducing $O_2$ gas into the processing chamber 201, high-density plasma of a mixed gas ($H_2+O_2$ gas) of $H_2$ gas and $O_2$ gas is generated in the plasma generating area 224. As a result of the generated high-density plasma, plasma processing is performed on the surface of the wafer 200 on the susceptor 217. At this time, the mixed gas of $H_2$ gas and $O_2$ gas is separated by the plasma, creating H, OH, and the like. The OH acts on the silicon and the W to oxidize both films. The H is reducing in relation to W and therefore effectively reduces the oxidized W surface, but also has little reducing strength in relation to polysilicon. The polysilicon is therefore oxidized as a result, but the W surface is not oxidized.

In Embodiment 1 as described above, the following are the reasons for providing a first step to introduce $H_2$ gas in advance instead of introducing $H_2$ gas and $O_2$ gas simultaneously in the second step.

The reducing strength of $H_2$ is less than the oxidation strength of $O_2$, and the W is oxidized and the surface of the W becomes rough in cases in which the gases are introduced simultaneously. The result of this roughening is that the wafer surface becomes uneven and the sheath resistance is not constant. Tungsten oxide is produced by the oxidation of the W surface, and this tungsten oxide adheres to the processing container 203 and the wafer. This adhesion on the processing container 203 affects the following wafer processing, the adhesion on the wafer 200 causes problems such as deterioration of the tunnel gate oxide film, and a leak current is generated as a result. In view of this, the amount of $H_2$ gas introduced in advance in the first step is kept sufficient for reduction, and $O_2$ gas is introduced in the second step while $H_2$ gas continues to be introduced.

In this case, the flow ratio of $O_2$ gas in relation to $H_2$ gas in the first step is preferably less than the flow ratio of $O_2$ gas in relation to $H_2$ gas in the second step. Furthermore, it is preferable that $H_2$ gas be supplied in the first step and that that $H_2$ gas continue to be supplied in the second step while oxygen $O_2$ is supplied in addition to $H_2$ gas. Furthermore, the flow rate of $O_2$ gas contained in the gas in the first step is preferably less than the flow rate of $O_2$ gas contained in the mixed gas in the second step. Furthermore, it is more preferable that no $O_2$ gas be supplied in the first step.

The gas introduced in the first step and second step may be any reducing gas that does not react with silicon. Ammonia is an example of a reducing gas, but cannot be used in selective oxidation because ammonia brings about nitridation. In cases in which Ar is introduced as in the prior art documents, the Ar activates oxidation, and is therefore not suitable for the selective oxidation of the present invention.

Step of Preparing Substrate to be Conveyed Out

After the supply of $H_2+O_2$ gas and discharge are stopped for the selective oxidation process, the interior of the processing chamber 201 is brought to the same pressure as the adjacent vacuous conveying chamber in order to convey the processed wafer 200 out of the processing chamber 201.

Substrate Conveying-Out Preparation Step

After the oxidation process is ended, the conveyor (not shown) is used to convey the wafer 200 to a specific position outside of the processing chamber 201 in the opposite sequence from the substrate introduction step, and the wafer 200 is cooled to a specific temperature and withdrawn outside of the apparatus.

The series of steps described above is performed, thus completing the wafer oxidation process.

In this series of steps, control is performed over the electric power control of the high-frequency power source 273 by the controller 121, adjustment of the integrator 272, the opening and closing of the valve 243a, the flow rate of the mass flow controller 241, the degree of opening of the APC 242, the opening and closing of the valve 243b, the starting and stopping of the vacuum pump 246, the raising and lowering operation of the susceptor elevating/lowering mechanism 268, the opening and closing of the gate valve 244, and the electric power control to the power source for applying voltage to the heater embedded in the susceptor.

According to Embodiment 1 described above, since $O_2$ gas and $H_2$ gas are supplied to the wafer in which the W film and polysilicon film are exposed in the device surface, the oxidation of the device surface can be suppressed. The oxidation of the W surface exposed on the wafer 200 is suppressed also because plasma discharge is performed to generate hydrogen plasma after a specific amount of time has passed since the supply of $H_2$ gas was begun, and the wafer is left in a hydrogen plasma atmosphere as a reducing atmosphere. Reduction can be maintained because $H_2$ gas continues to flow into the processing chamber in which plasma discharge continues. Since the atmosphere over the waver does not contain $O_2$ at the start of plasma discharge, the wafer is not oxidized rapidly, and it is possible perform a selective oxidation process that does not cause W surface roughness.

Rapid excitation of the $O_2$ gas can be inhibited, as can rapid oxidation of the wafer, because discharge is initiated in an $H_2$ gas atmosphere and $O_2$ gas is then gradually added, whereby appropriate oxidation can be continued while maintaining reduction. Oxidation of the W portion exposed on the wafer can be more reliably suppressed, and it is possible to more reliably oxidize only the polysilicon layer because the mixed gas of $H_2$ gas and $O_2$ gas is caused to form a plasma discharge to generate OH, H, and the like.

When the interior of the processing chamber is purged by $H_2$ gas after the pressure adjustment step preceding discharge initiation for generating $H_2$ plasma, the $O_2$ concentration in the processing chamber can be reduced, and more efficient selective oxidation can be performed. Furthermore, oxidation of the wafer from the temperature-raising stage onward can be suppressed by raising the temperature while feeding $H_2$ gas also during the substrate temperature-raising step preceding the pressure adjustment step.

Particularly, when a MMT (modified magnetron) system is used as the plasma generating method for exciting $O_2$ and $H_2$ mixed gas or $H_2$ gas only, the structure can be simplified because existing facilities can be used without modification. Using plasma makes it possible to selectively oxidize a wafer at a low temperature of 700° C. or less. Oxidation of the W layer can be reliably prevented because the flow ratio of $O_2$:$H_2$ can be reduced without reducing the oxidation rate.

As shown in FIG. 1, an experiment for oxidizing the surface of the W substrate was conducted in order to evaluate the process when $H_2$ gas is fed in the first step to reduce the wafer, and $H_2$ gas and $O_2$ gas are fed in the second step and simultaneously stopped to selectively oxidize the wafer.

FIG. 2 is an SEM photograph showing the experiment results obtained when the oxidation process is performed on the surface of a W substrate. (a) shows an unprocessed surface, (b) shows a surface oxidized in an $O_2$ atmosphere (Comparative Example 1), (c) shows a surface oxidized in an $O_2$+$H_2$ atmosphere (Comparative Example 2), and (d) shows a surface oxidized by adding $O_2$ while performing the process in the $H_2$ atmosphere of the example (Example).

The common oxidation conditions are a heater set temperature of 900° C., a furnace internal pressure of 100 Pa, and an applied voltage of 350 W. The $O_2$ flow rate in Comparative Example 1 is 400 sccm, and the $O_2$ gas flow rate is 44 sccm while the $H_2$ gas flow rate is 356 sccm (flow ratio of $O_2$ gas and $H_2$ gas is 1:8) in Comparative Example 2 and in the Example It is clear from FIG. 2 that in the Example (d), the W substrate surface was not oxidized and there was no surface roughness, while in Comparative Example 1 (b), the surface was oxidized, and surface roughness occurred to the extent that the surface shape changed and crystal grains of tungsten oxide could be confirmed. In Comparative Example 2(c), the surface was slightly oxidized and surface roughness remained. Therefore, it was thereby made clear that the method of the oxidation process in the present Example was effective for suppressing W oxidation and that this method made it possible to prevent W surface roughness.

Therefore, if the oxidation processing method of the present invention is applied to the oxidation step in a gate structure of a flash memory that uses W or another such metal in a control gate electrode, for example, the control gate electrode portion exposed on the substrate is not oxidized, and side walls of the polysilicon portion can be effectively oxidized.

However, in selective oxidation, it is clear that when the $O_2$ gas and $H_2$ gas are simultaneously stopped, W is generated, and the surface is contaminated by the W. Several causes for this have been considered, and although it is not clearly understood, it is believed that the oxygen plasma knocks out contaminant substances from the wafer, these knocked-out contaminant substances are suspended within the plasma, and the substances adhere to the interior of the processing chamber when the plasma discharge is stopped. Therefore, the W adhering to the interior of the processing container 203 must be cleaned out after a specific number of wafers have been processed, and throughput is reduced. To resolve this problem, the suspended amount of W must be reduced before plasma discharge is stopped.

FIG. 3 is a diagram of the gas flow and discharge sequence, wherein the substrate processing method of Embodiment 2 is described. The difference from Embodiment 1 shown in FIG. 1 is that in Embodiment 1, the supply of $H_2$ gas and $O_2$ gas was simultaneously stopped to stop plasma discharge when selective oxidation by mixed plasma had ended, while in Embodiment 2, the supply of $H_2$ gas is continued for a certain time after the supply of $O_2$ gas is stopped, and the wafer continues to be processed by hydrogen plasma.

In the Embodiment 2 described hereinbelow, the substrate processing step is referred to as the third step despite being identical to the first substrate processing step (the second step). The reason for this is because a fourth step performed after the third step of Embodiment 2 does not necessarily need to be added as a continuation of the third step after the hydrogen plasma discharge step (first step) and the substrate processing step (second step) of Embodiment 1, and an $O_2$ gas introduction stopping step may be performed after the substrate processing step, separate from the hydrogen plasma discharge step. Therefore, the substrate processing step identical to that of Embodiment 1 is referred to as a third step.

Substrate Processing Step (Third Step)

As shown in FIG. 3, the wafer 200 is subjected to a selective oxidation process by mixed plasma containing $H_2$ gas and $O_2$ gas, similar to the substrate processing step (second step) of Embodiment 1.

$O_2$ Gas Introduction Stopping Step (Fourth Step)

As plasma discharge for the selective oxidation process is about to end, the oxygen flow is stopped, $H_2$ gas alone is used for the gas flow, and an electric discharge is performed in which the high-frequency voltage applied from the high-frequency power source 273 is reduced to about 100 W or less, which is lower than the third step. The reduction in discharge electric power is shown in FIG. 3 by the gradual reduction in the height indicating the discharged amount. As a result of using only $H_2$ gas for the gas flow and reducing the electric power of the discharge to about 100 W, only the H in the atmosphere in the processing chamber 201 is excited, and the W in the atmosphere in the processing chamber 201 is reduced by the excited H and is quickly exhausted out of the processing chamber 201. The applied high-frequency voltage may be reduced incrementally or continuously.

The valve 243*a* is closed to stop the supply of $H_2$ gas from the gas inlet port 234, the application of high-frequency voltage to the cylindrical electrode 215 is stopped to end the substrate processing, and preparations to convey out the substrate are begun.

The reason that the generation of W can be inhibited by stopping the inflow of $O_2$ gas is not necessarily clear, but is estimated to be as follows.

Since oxygen radicals have greater longevity than hydrogen radicals, it is believed that the oxygen radicals remain longer than the hydrogen radicals in cases in which the inflows of $H_2$ gas and $O_2$ gas are stopped simultaneously. As a result, the W is oxidized by the remaining oxygen radicals and is scattered throughout the processing container 203. In view of this, stopping first the inflow of $O_2$ gas results in the longevity of the hydrogen radicals and oxygen radicals expiring simultaneously so that no $O_2$ gas remains and the generation of W is suppressed.

In this case, the oxygen concentration in the gas in the fourth step is enough to sufficiently suppress oxidation if the processing container is evacuated for about 30 seconds, for example, and is preferably 12% or less. Particularly, the oxygen/hydrogen ratio is preferably 1:8, and the hydrogen concentration is preferably 11.1%. The flow ratio of $O_2$ gas in relation to $H_2$ gas in the fourth step is preferably less than the flow ratio of $O_2$ gas in relation to $H_2$ gas in the third step. Furthermore, it is preferable that the wafer be selectively oxidized by the mixed plasma in the third step, and that the supply of $O_2$ gas be stopped in the fourth step. Furthermore, the flow rate of $O_2$ gas contained in the gas in the fourth step is preferably less than the flow rate of $O_2$ gas contained in the mixed gas in the third step. Furthermore, $O_2$ gas is preferably not supplied in the fourth step.

Thus, in Embodiment 2, the oxygen plasma and the hydrogen plasma perform selective oxidation in the third step, the supply of $O_2$ gas is stopped in the fourth step, $H_2$ gas plasma alone is generated, and contamination with W from the wafer 200 is suppressed. The amount of suspended W prior to the stopping of plasma discharge can thereby be reduced, and either no or very little, if any, W oxide therefore adheres to the interior of the processing container 203 even after the same number of wafers as in the conventional example are processed. Therefore, there is no need to clean the W, and throughput can be further improved.

As shown in FIG. 3, experiments were conducted regarding conditions under which metal contamination occurred in processing containers 203 to which the gas flows and discharge sequences of Embodiment 2 (FIG. 3) and the conventional example (FIG. 7) were respectively applied. The aim of the experiments was to evaluate the process in which selective oxidation was performed by the oxygen plasma and hydrogen plasma in the third step, the supply of $O_2$ gas was stopped in the fourth step, $H_2$ gas plasma alone was generated, and contamination with W from the wafer was suppressed.

FIGS. 4 and 5 show the results of experiments regarding conditions under which metal contamination occurred in the processing containers 203 in which Embodiment 3 and the conventional example were respectively applied. The vertical axis shows concentration in units of atms/cm². The horizontal axis shows the elements Li, Na, Mg, Al, K, Ca, Cr, Mn, Fe, Ni, Cu, Zn, and particularly W, aligned from left to right. The contamination concentration of each metal is shown in a bar graph.

In FIG. 4, the terms "before processing," "After 10," "After 25," and the like refer to the contamination conditions before the first wafer is processed, the contamination conditions after the tenth wafer is processed, the contamination conditions after the twenty-fifth wafer is processed, and the like. In FIG. 5, the terms "After one," "After 10," and the like similarly refer to the contamination conditions after the first wafer is processed, the contamination conditions after the tenth wafer is processed, and the like. The bar graphs showing the contamination conditions are drawn so that when multiple bars are aligned adjacently for the same metal, the number of wafers processed increases from left to right.

In the W contamination conditions in the conventional example shown in FIG. 5, high W concentrations were detected, wherein the concentration had already reached nearly $1.70 \times 10^{11}$ [atms/cm²] after the "first," and the concentration exceeded $1.00 \times 10^{12}$ [atms/cm²] from the "second" to "after ten."

In the W contamination conditions in the Embodiment shown in FIG. 4, a low W concentration of about $1.3 \times 10^{10}$ [atms/cm²] is shown even after five and ten wafers, and it is clear that the W concentration is significantly reduced in comparison with the conventional example. The W concentration does not increase from 15 wafers onward and never exceeds $1.50 \times 10^{10}$ [atms/cm²], and it is therefore clear that metal contamination by W can be continuously reduced.

A case was described in which the substrate processing methods of Embodiments 1 and 2 described above were performed separately and independently, but the present invention is not limited to this option alone. The substrate processing step (second step) of Embodiment 1 and the substrate processing step (third step) of Embodiment 2 can be treated as the same step, and the first through fourth steps can be performed as one continuous step, in which case the effects of preventing surface roughness and W contamination are particularly greater.

In the embodiments described above, $O_2$ gas was used in a mixed gas with $H_2$ gas, but an oxygen-containing gas other than $O_2$ may be used, and examples of oxygen-containing gases include nitrous oxide ($N_2O$) gas and nitric oxide (NO) gas. In addition to tungsten (W), examples of the metal to which the present invention can be applied include Mo (molybdenum), Pa (palladium), Ro (Rhodium), Ru (rubidium), Ni (nickel), Co (cobalt), Ta (tantalum), Ti (titanium), Al (aluminum), Cu (copper), and the like. A case was described in the embodiments in which the present invention was applied to the gate structure of a flash memory, but the present invention can also be applied to the gate structure of a DRAM.

The preferred aspects of the present invention are described.

A first aspect is a substrate processing method including a step of generating mixed plasma by causing a mixed gas of hydrogen gas and oxygen or oxygen-containing gas supplied to a processing chamber to form a plasma discharge, and processing the substrate by the mixed plasma; and a step of generating hydrogen plasma by causing hydrogen gas supplied to the processing chamber to form a plasma discharge, and processing the substrate by the hydrogen plasma.

In the step of performing the process with mixed plasma, the substrate is processed with mixed plasma containing hydrogen gas and oxygen or oxygen-containing gas, and the substrate can therefore be appropriately oxidized. In the step of performing the process with hydrogen plasma, the substrate is processed with hydrogen plasma, and oxidation of the substrate can therefore be suppressed.

A second aspect is the first aspect, wherein the step of performing a process with the hydrogen plasma is a first step, and a step of performing a process with the mixed plasma is performed as a second step after the first step.

When hydrogen gas and oxygen gas are supplied simultaneously, it is believed that a phenomenon occurs in which only the oxygen is first activated immediately after the plasma discharge begins, the surface of the substrate is slightly oxidized, the subsequent activation of hydrogen causes the oxide film to be removed, and surface roughness remains in the substrate. Therefore, a first step of performing plasma discharge with only hydrogen gas is first carried out, a second step is then performed in which hydrogen gas and oxygen gas are both supplied, and an oxidation process is begun, as in the present aspect. When these steps are performed, the substrate can be oxidized while suppressing the oxidation of the substrate, and a process can be performed to suppress rapid oxidation of the substrate, resulting in little surface roughness.

A third aspect is the second aspect, wherein the oxygen concentration in the gas in the first step is 1 part oxygen per 8 parts hydrogen by volume (11.1% or less).

In cases in which oxygen remains on the substrate during the first step, a problem is particularly likely to be encountered in which reduction of substrate oxidation is insufficient. According to the present aspect, however, oxidation of the substrate can be reliably suppressed, and a process resulting in less surface roughness can be performed since the oxygen concentration is 11.1% or less.

A fourth aspect is the second aspect, wherein the flow ratio of oxygen gas in relation to the hydrogen gas in the first step is less than the flow ratio of oxygen gas in relation to the hydrogen gas in the second step.

In cases in which the gas contains oxygen gas during the first step, a problem is particularly likely to be encountered in which oxidation of the substrate is inadequately suppressed. According to the present aspect, however, oxidation of the substrate can be reliably suppressed because the oxygen gas flow ratio in the first step is less than the oxygen gas flow ratio in the second step. In the second step, since the oxygen gas flow ratio in the second step is greater than the oxygen gas flow ratio in the first step, the substrate can be appropriately oxidized, and a process resulting in less surface roughness can be performed.

A fifth aspect is the second aspect, wherein hydrogen gas is supplied in the first step, and the supply of the hydrogen gas is continued while oxygen gas is supplied in addition to the hydrogen gas in the second step.

In cases in which oxygen remains on the substrate during the first step, in which oxidation of the substrate is inadequately suppressed. According to the present aspect, however, hydrogen gas is supplied in the first step, and oxidation of the substrate can therefore be reliably suppressed. In the second step, since oxygen gas is supplied in addition to hydrogen gas, the substrate can be appropriately oxidized, and a process resulting in less surface roughness can be performed.

A sixth aspect is the second aspect, wherein the flow rate of oxygen gas contained in the gas in the first step is less than the flow rate of oxygen gas contained in the mixed gas in the second step.

In cases in which the gas contains oxygen gas during the first step, a problem is particularly likely to be encountered in which the reduction of substrate oxidation is insufficient. According to the present aspect, however, oxidation of the substrate can be reliably suppressed because the oxygen gas flow rate in the first step is less than the oxygen gas flow rate in the second step. In the second step, since the oxygen gas flow rate in the second step is greater than the oxygen gas flow rate in the first step, the substrate can be appropriately oxidized, and a process resulting in less surface roughness can be performed.

A seventh aspect is the second aspect, wherein oxygen gas is not supplied in the first step.

In cases in which oxygen gas is supplied during the first step, a problem is particularly likely to be encountered in which oxidation of the substrate is inadequately suppressed. According to the present aspect, however, oxidation of the substrate can be reliably suppressed, and a process resulting in less surface roughness can be performed since oxygen gas is not supplied in the first step.

An eighth aspect is the first aspect, wherein a step of performing a process with the mixed plasma is a third step, and a step of performing a process with the hydrogen plasma is performed as a fourth step after the third step.

It is believed that the oxygen plasma knocks out contaminant substances from the substrate, that these knocked-out contaminant substances are suspended in the plasma, and that the substances adhere to the substrate when the plasma discharge is stopped. Therefore, when a fourth step is performed in which the process is carried out with hydrogen plasma after the third step as in the present aspect, contamination occurring at the end of oxidation can be reduced to improve throughput.

A ninth aspect is the eighth aspect, wherein the oxygen concentration in the gas in the fourth step is enough to sufficiently suppress oxidation if the processing container is evacuated for about 30 seconds, and is preferably 12% or less. Particularly, the oxygen/hydrogen ratio is preferably 8:1, and the oxygen concentration is preferably 11.1%.

In cases in which oxygen remains during the fourth step, contamination by the oxygen is particularly likely to be a problem. According to the present aspect, however, contamination occurring at the end of oxidation can be reliably reduced to improve throughput since the oxygen concentration is 11.1%.

A tenth aspect is the eighth aspect, wherein the flow ratio of oxygen gas in relation to the hydrogen gas in the third step is less than the flow ratio of oxygen gas in relation to the mixed gas in the fourth step.

In cases in which the gas contains oxygen gas during the fourth step, a problem of insufficiently reduced contamination is particularly likely to be encountered. According to the present aspect, however, contamination occurring at the end of oxidation can be reliably reduced to improve throughput since the flow ratio of oxygen gas in the fourth step is less than the flow ratio of oxygen gas in the third step.

An eleventh aspect is the eighth aspect, wherein the substrate is selectively oxidized by the mixed plasma in the third step, and the supply of oxygen gas is stopped in the fourth step.

In cases in which the gas contains oxygen gas during the fourth step, a problem of insufficiently reduced contamination is particularly likely to be encountered. According to the present aspect, however, contamination occurring at the end of oxidation can be reliably reduced to improve throughput since the supply of oxygen gas is stopped in the fourth step.

A twelfth aspect is the eighth aspect, wherein the flow rate of oxygen gas contained in the gas in the fourth step is less than the flow rate of oxygen gas contained in the mixed gas in the third step.

In cases in which the gas contains oxygen gas during the fourth step, a problem of insufficiently reduced contamination is particularly likely to be encountered. According to the present aspect, however, contamination occurring at the end of oxidation can be reliably reduced to improve throughput since the flow rate of oxygen gas in the fourth step is less than the flow rate of oxygen gas in the third step.

A thirteenth aspect is the eighth aspect, wherein oxygen gas is not supplied in the fourth step.

In cases in which the gas contains oxygen gas during the fourth step, a problem of insufficiently reduced contamination is particularly likely to be encountered. According to the present aspect, however, contamination occurring at the end of oxidation can be reliably reduced to improve throughput since oxygen gas is not supplied in the fourth step.

A fourteenth aspect includes a processing chamber that processes a substrate; a mixed gas inlet port that introduces a mixed gas of hydrogen gas and oxygen or oxygen-containing gas into the processing chamber; a hydrogen gas inlet port that introduces hydrogen gas into the processing chamber; an exhaust port that evacuates the interior of the processing chamber; plasma generating part that generates mixed plasma by causing the mixed gas introduced into the processing chamber to form a plasma discharge, and generates hydrogen plasma by causing the hydrogen gas introduced into the processing chamber to form a plasma discharge; and controller that performs control so that the mixed gas introduced through the mixed gas inlet port is caused to form a plasma discharge and is supplied to the processing chamber while exhausted through the exhaust port, and so that the hydrogen gas introduced through the hydrogen gas inlet port is caused to form a plasma discharge and is supplied to the processing chamber while exhausted through the exhaust port.

The substrate processing method of the first aspect can easily be implemented by providing controller that performs control so that mixed plasma introduced through the mixed gas supply port and generated by plasma discharge is supplied to the processing chamber while exhausted out through the exhaust port, and hydrogen plasma introduced through the hydrogen gas supply port and generated by plasma discharge is supplied to the processing chamber while exhausted out through the exhaust port.

A fifteenth aspect is the fourteenth aspect, wherein the controller performs control so that the hydrogen gas introduced through the hydrogen gas inlet port is caused to form a plasma discharge and supplied to the processing chamber while exhausted through the exhaust port, and thereafter the mixed gas introduced through the mixed gas inlet port is caused to form a plasma discharge and supplied to the processing chamber while exhausted through the exhaust port.

The substrate processing method of the second aspect can be easily implemented when the controller performs control so that hydrogen plasma introduced through the hydrogen gas supply port and generated by plasma discharge is supplied to the processing chamber while exhausted out through the exhaust port, and mixed plasma introduced through the mixed gas supply port and generated by plasma discharge is supplied to the processing chamber while exhausted out through the exhaust port.

A sixteenth aspect is the fourteenth aspect, wherein the controller performs control so that the mixed gas introduced through the mixed gas inlet port is caused to form a plasma discharge and supplied to the processing chamber while exhausted through the exhaust port, and thereafter the hydrogen gas introduced through the hydrogen gas inlet port is caused to form a plasma discharge and supplied to the processing chamber while exhausted through the exhaust port.

The substrate processing method of the eighth aspect can be easily implemented when the controller performs control so that mixed plasma introduced through the mixed gas supply port and generated by plasma discharge is supplied to the processing chamber while exhausted out through the exhaust port, and hydrogen plasma introduced through the hydrogen gas supply port and generated by plasma discharge is supplied to the processing chamber while exhausted out through the exhaust port.

A seventeenth aspect is a manufacturing method of a semiconductor device, including a step of generating mixed plasma by causing a mixed gas of hydrogen gas and oxygen or oxygen-containing gas supplied to a processing chamber to form a plasma discharge, and processing the starting substrate by the mixed plasma; and a step of generating hydrogen plasma by causing hydrogen gas supplied to the starting substrate to form a plasma discharge, and processing the substrate by the hydrogen plasma.

An eighteenth aspect is the seventeenth aspect, wherein the step of performing a process with the hydrogen plasma is a first step, and a step of performing a process with the mixed plasma is performed as a second step after the first step.

A nineteenth aspect is the seventeenth aspect, wherein a step of performing a process with the mixed plasma is a third step, and a step of performing a process with the hydrogen plasma is performed as a fourth step after the third step.

KEY

Figure 1:
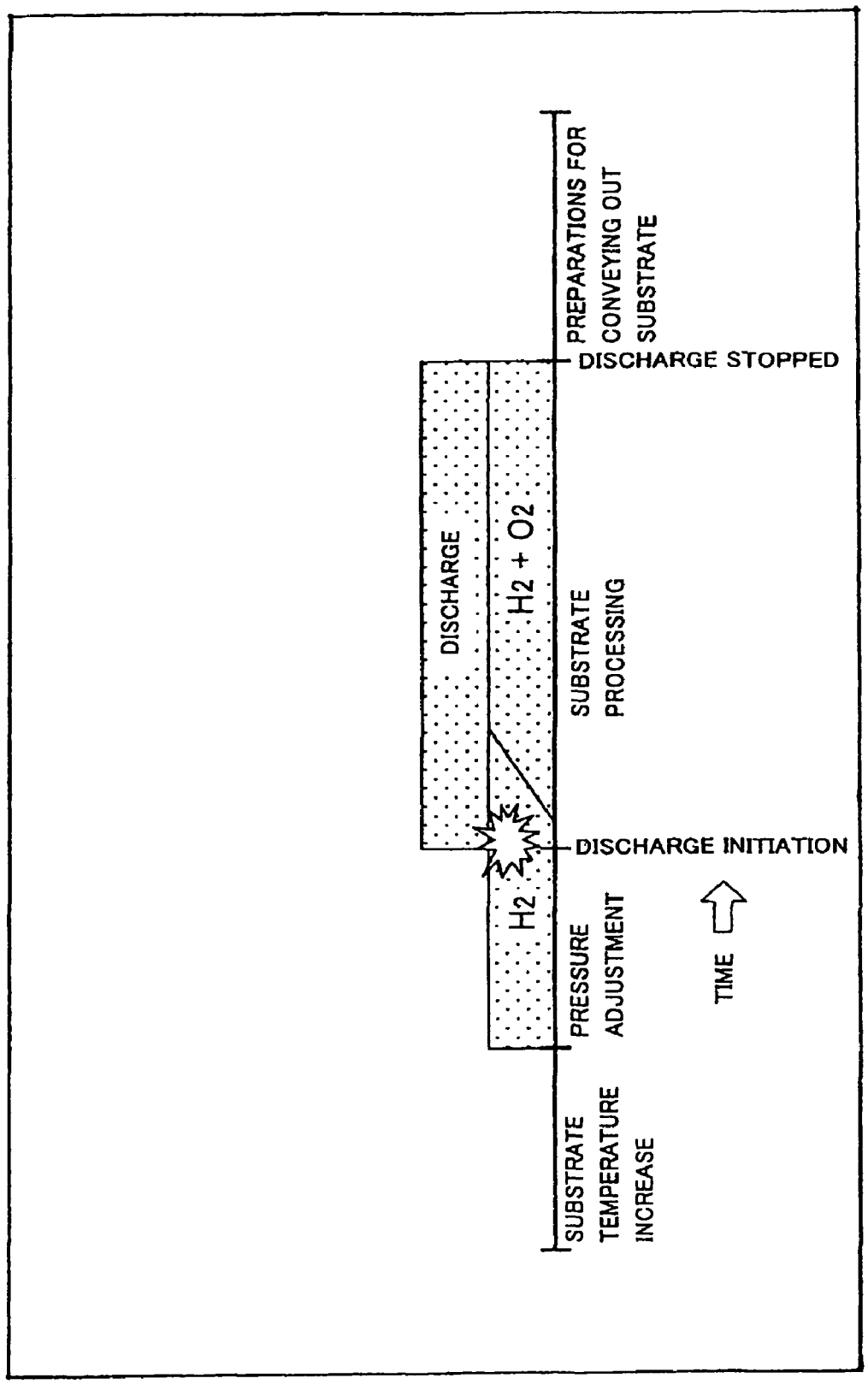
FIG. 1 is an explanatory diagram of a plasma processing method of Embodiment 1.
Figure 2:
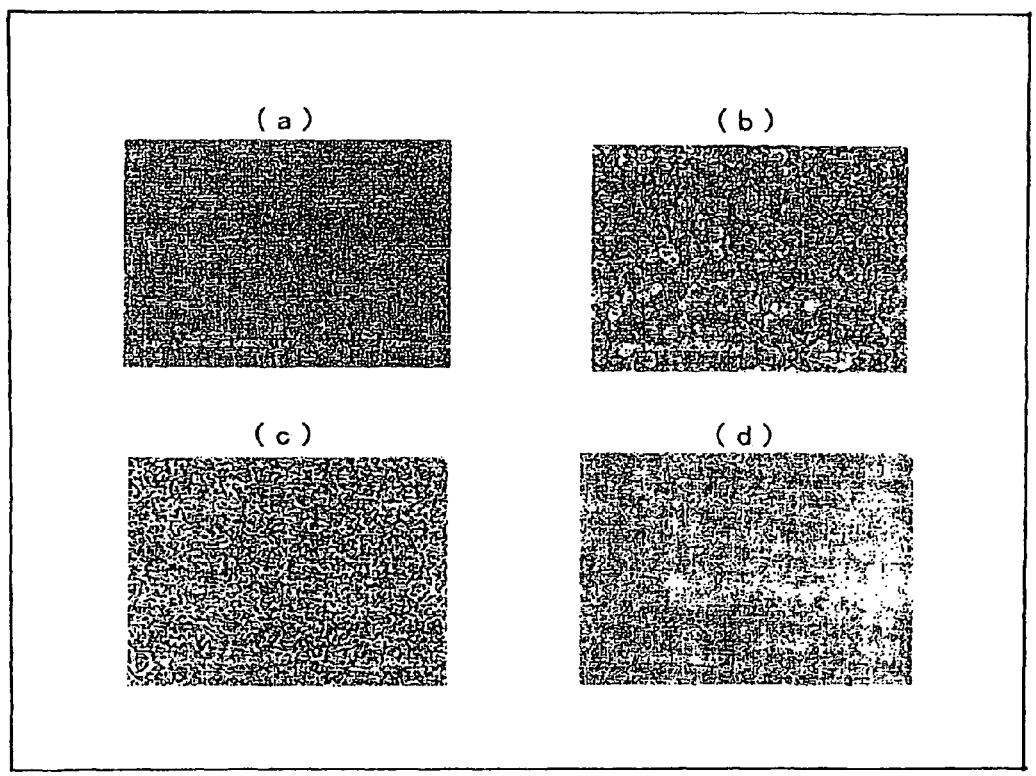
FIG. 2 is an SEM photograph of the surface of the W substrate according to Embodiment 1 when subjected to the oxidation process, wherein (a) is an unprocessed surface, (b) is Comparative Example 1, (c) is Comparative Example 2, and (d) is an Embodiment.
Figure 3:
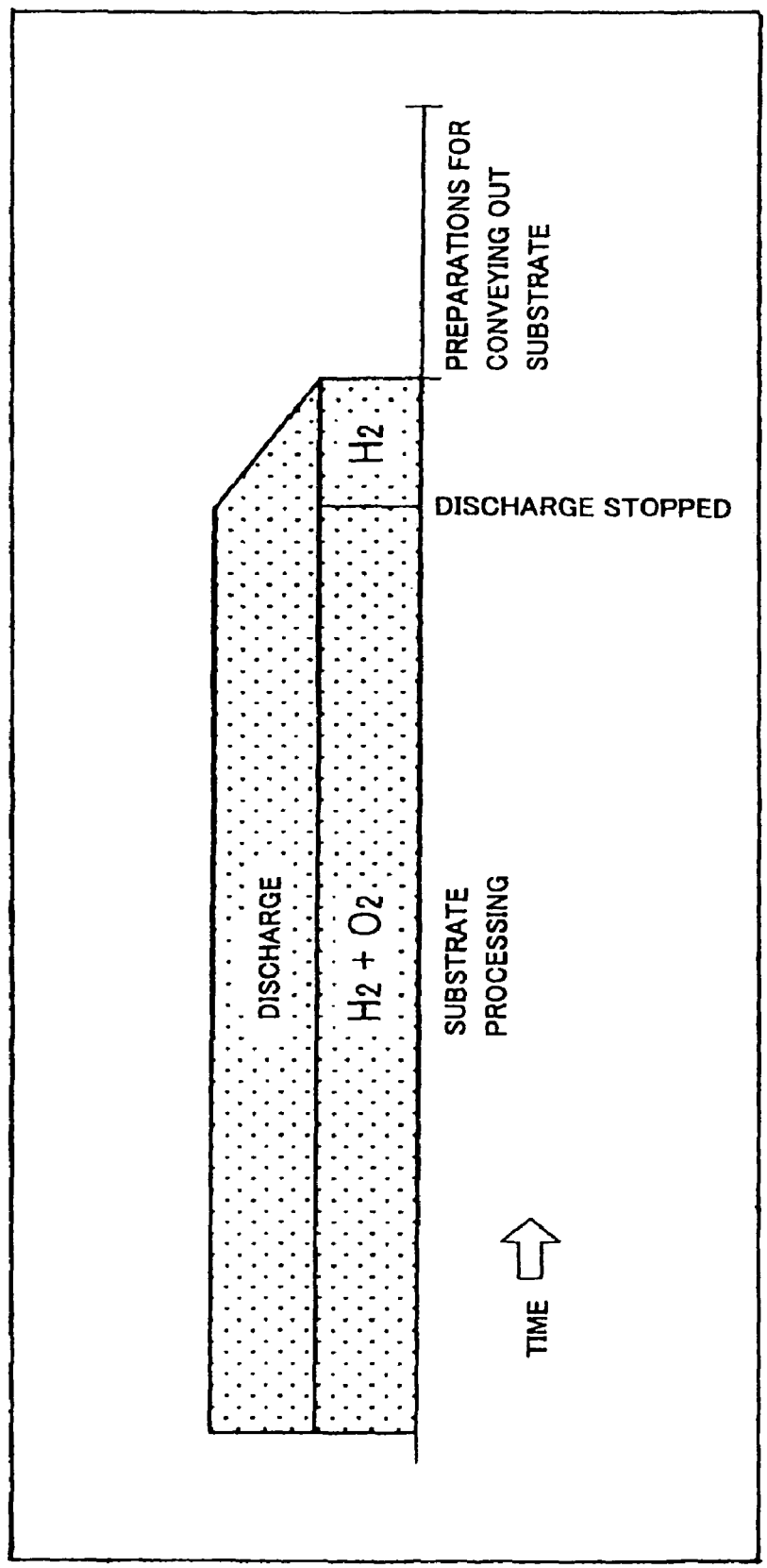
FIG. 3 is an explanatory diagram of a plasma processing method showing an example a gas flow and a discharge sequence in Embodiment 2.
Figure 4:
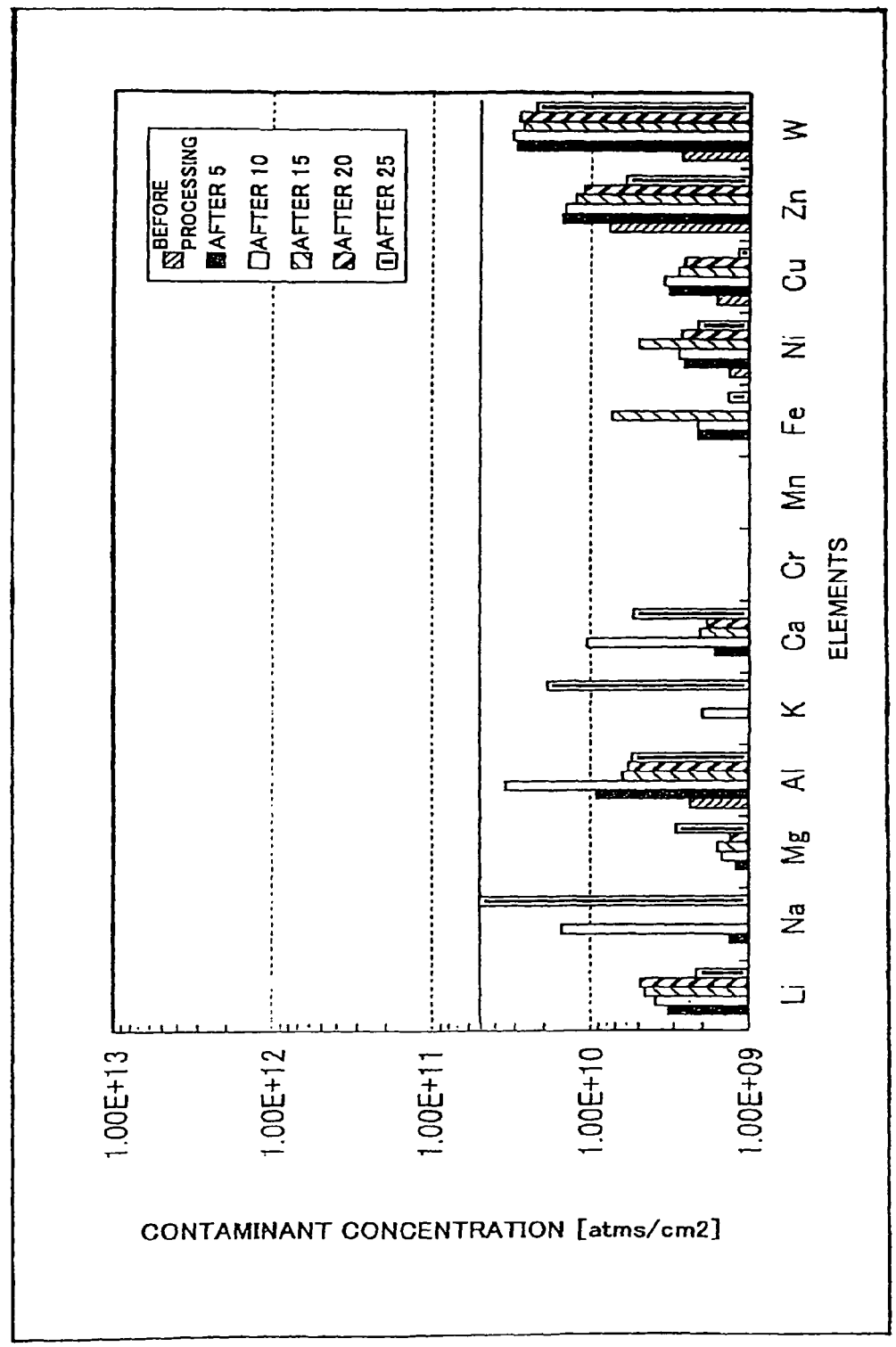
FIG. 4 is an explanatory diagram showing conditions causing metal contamination in which Embodiment 2 is applied.
Figure 5:
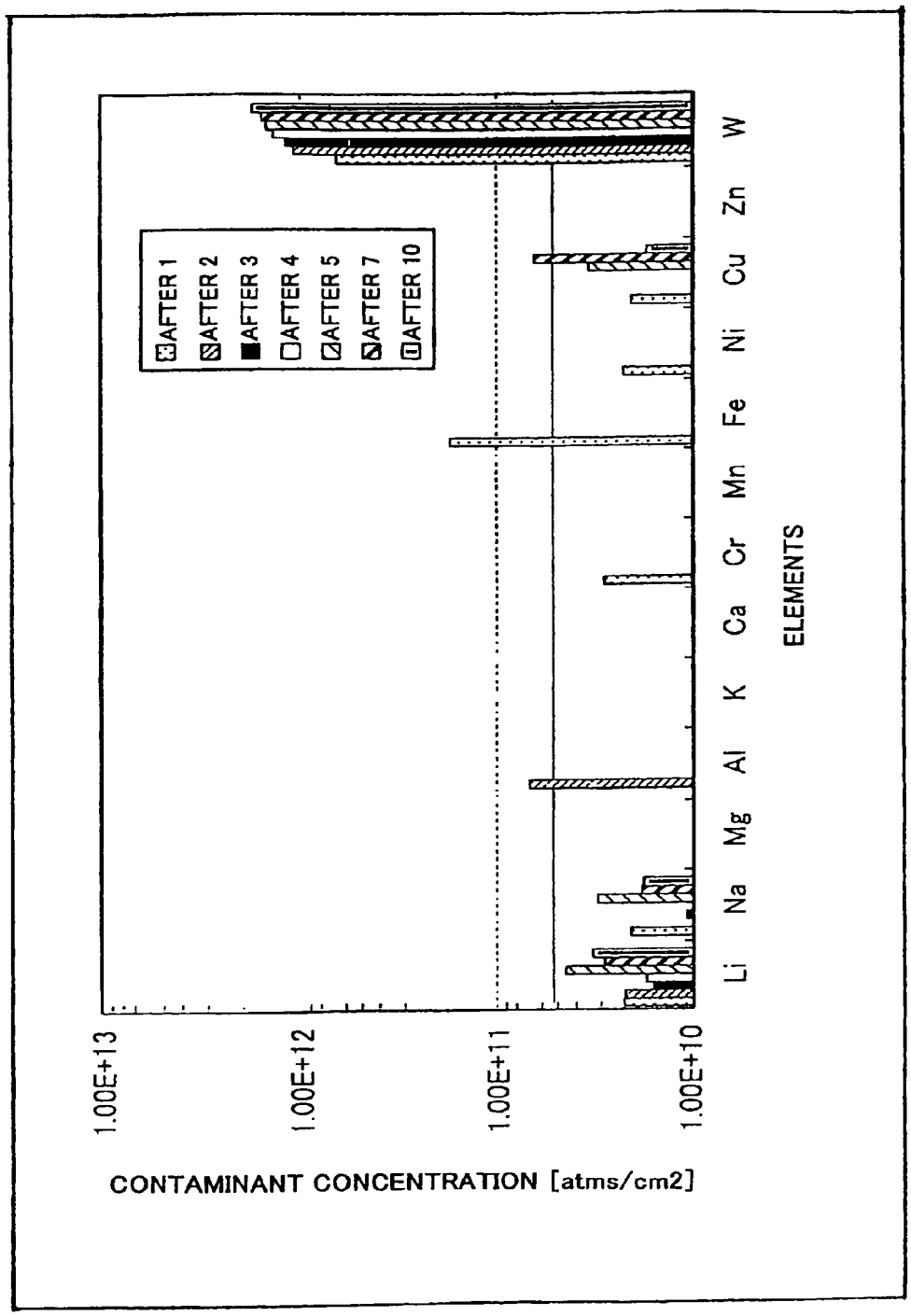
FIG. 5 is an explanatory diagram showing conditions causing metal contamination when the conventional example is applied.
Figure 6:
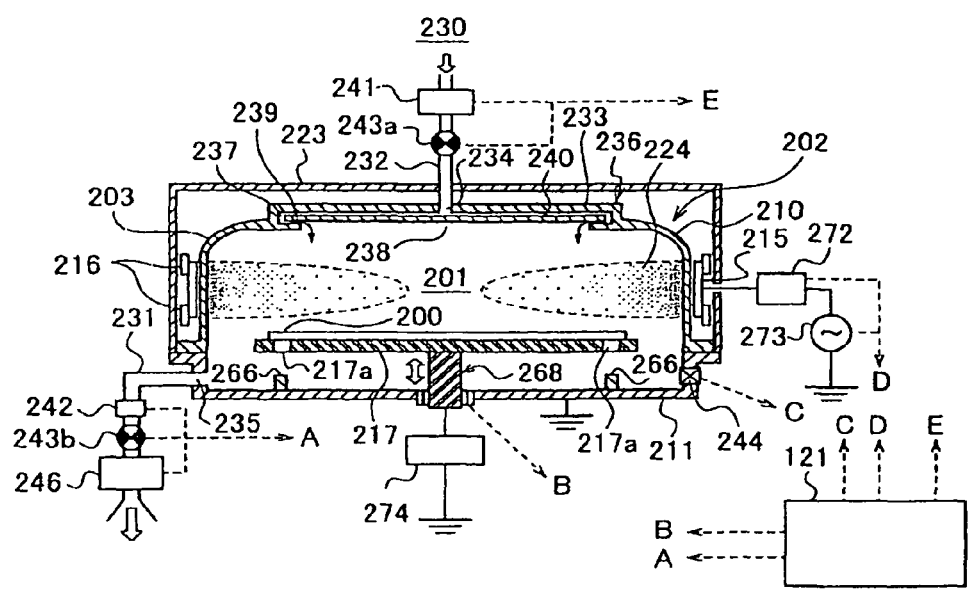
FIG. 6 is a schematic longitudinal cross-sectional view of an MMT plasma semiconductor manufacturing apparatus used in Embodiments 1 and 2.
Figure 7:
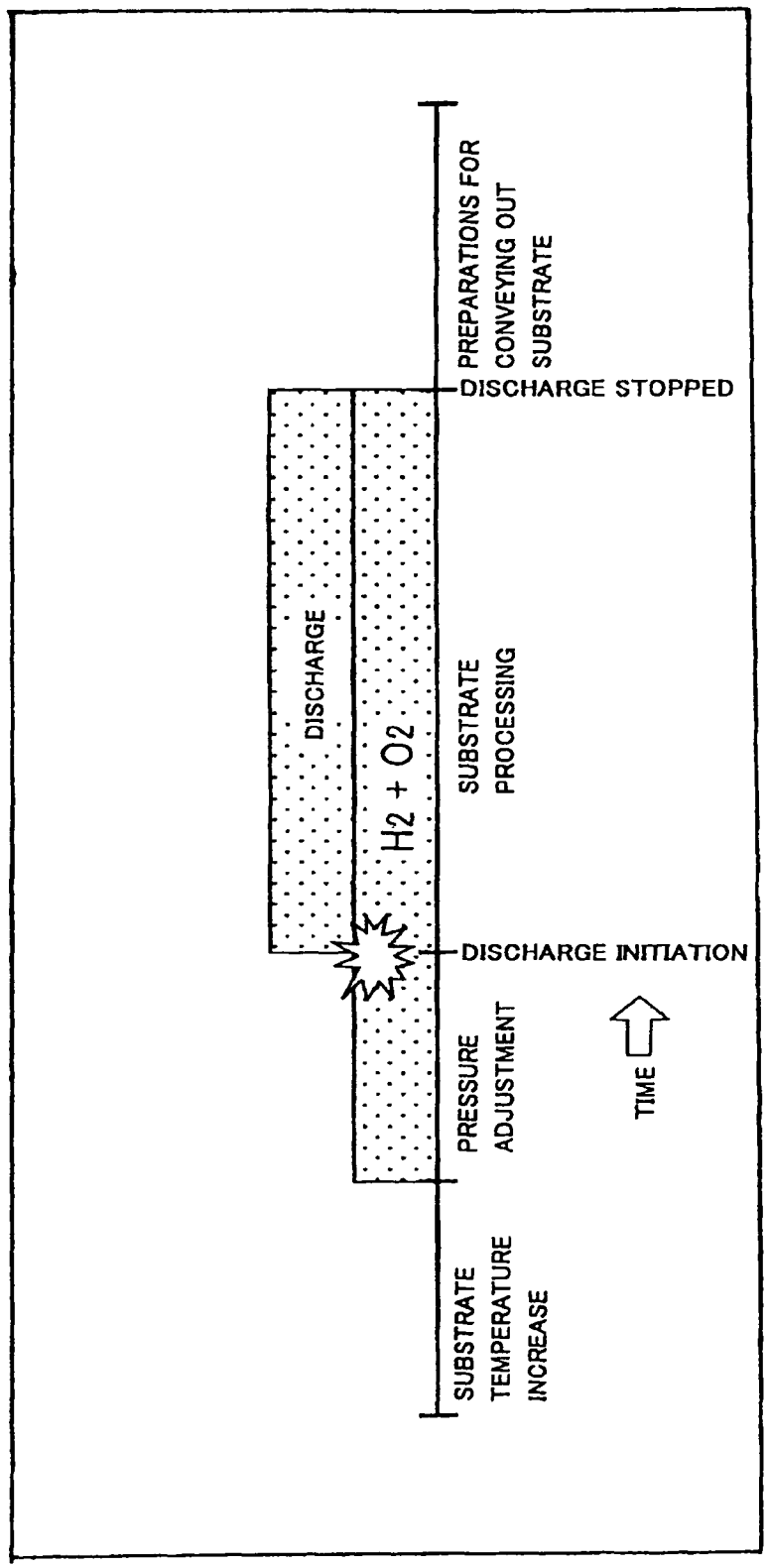
FIG. 7 is an explanatory diagram of the plasma processing method in the conventional example.

200 Wafer (substrate)
234 Gas inlet port
240 Shower plate
224 Plasma production area

The invention claimed is:

1. A substrate processing method comprising:
generating mixed plasma by plasma discharge of a mixed gas of hydrogen gas and oxygen or oxygen-containing gas supplied to a processing chamber, and processing a substrate on a surface of which a polysilicon film and a metal film are exposed by said mixed plasma; and
generating hydrogen plasma by the plasma discharge of hydrogen gas supplied to the processing chamber, and processing said substrate by said hydrogen plasma,
wherein the processing said substrate by said hydrogen plasma is a first step, and the processing a substrate on a surface of which a polysilicon film and a metal film are exposed by said mixed plasma is a second step after said first step.

2. The substrate processing method of claim 1, wherein when a process of the substrate by the first step and the second step is repeated, concentration of the oxygen gas remaining in the processing chamber in said first step, as a result of the preliminary substrate processing, is 11.1% or less.

3. The substrate processing method of claim 1, wherein the oxygen gas or the oxygen-contained gas except for the hydrogen gas is provided to the processing chamber in the first step, and the flow ratio of oxygen gas in relation to said hydrogen gas in said first step is less than the flow ratio of oxygen gas in relation to said hydrogen gas in said second step.

4. The substrate processing method of claim 1, wherein hydrogen gas is supplied in said first step, and the supply of said hydrogen gas is continued, and oxygen gas is supplied in addition to the hydrogen gas in said second step.

5. The substrate processing method of claim 1, wherein the oxygen gas or the oxygen-containing gas except for the hydrogen gas is provided to the processing chamber in the first step, and the flow rate of oxygen gas contained in the gas in said first step is less than the flow rate of oxygen gas contained in said mixed gas in said second step.

6. The substrate processing method of claim 1, wherein oxygen gas is not supplied in said first step.

7. The substrate processing method of claim 1, wherein the step of performing a process with said mixed plasma is a third step, and the step of performing a process with said hydrogen plasma is performed as a fourth step after said third step.

8. The substrate processing method of claim 7, wherein a concentration of the oxygen-containing gas remaining in the processing chamber in said fourth step as a result of the plasma processing in the third step is 11.1% or less.

9. The substrate processing method of claim 7, wherein the substrate is selectively oxidized by said mixed plasma in the third step, and the supply of oxygen gas is stopped in said fourth step.

10. The substrate processing method of claim 7, wherein the oxygen gas or the oxygen-containing gas except for the hydrogen gas is provided to the processing chamber in the first step, and a flow rate of oxygen gas contained in the gas in said fourth step is less than a flow rate of oxygen gas contained in said mixed gas in said third step.

11. The substrate processing method of claim 7, wherein oxygen gas is not supplied in said fourth step.

12. A substrate processing method comprising:
generating mixed plasma by plasma discharge of a mixed gas of hydrogen gas and oxygen or oxygen-containing gas supplied to a processing chamber, and processing a substrate on a surface of which a polysilicon film and a metal film are exposed by said mixed plasma; and
generating hydrogen plasma by plasma discharge of hydrogen gas supplied to the processing chamber, and processing said substrate by said hydrogen plasma,
wherein the processing a substrate on a surface of which a polysilicon film and a metal film are exposed by said mixed plasma a is a third step, and the processing said substrate by said hydrogen plasma is a fourth step after said third step; and
the oxygen gas or the oxygen-containing gas except for the hydrogen gas is provided to the processing chamber in the fourth step, and a flow ratio of oxygen gas in relation to said hydrogen gas in the fourth step is less than a flow ratio of oxygen gas in relation to said mixed gas in said third step.

13. A substrate processing apparatus including:
a processing chamber that processes a substrate on a surface of which a polysilicon film and a metal film are exposed;
a mixed gas inlet port that introduces a mixed gas of hydrogen gas and oxygen or oxygen-containing gas into said processing chamber;
a hydrogen gas inlet port that introduces hydrogen gas into said processing chamber;
an exhaust port that evacuates an interior of said processing chamber;
a plasma generating part that: i) generates mixed plasma by plasma discharge of said mixed gas of hydrogen gas and oxygen or oxygen-containing gas supplied to the processing chamber, and ii) generates a hydrogen plasma by the plasma discharge of hydrogen gas supplied to the processing chamber; and
a controller that performs control so that said mixed gas introduced through said mixed gas inlet port is caused to form said plasma discharge of said mixed gas of hydrogen gas and oxygen or oxygen-containing gas and is supplied to the substrate while exhausted through said exhaust port, and so that said hydrogen gas introduced through said hydrogen gas inlet port is caused to form said plasma discharge of hydrogen gas and is supplied to the substrate while exhausted through said exhaust port; wherein
the processing chamber processes said hydrogen plasma is a first step, and processes the substrate on a surface of which a polysilicon film and a metal film are exposed second step after said first step.

14. The substrate processing apparatus of claim 13, wherein said
controller performs control so that said hydrogen gas introduced through said hydrogen gas inlet port is caused to form a plasma discharge and supplied to the substrate while exhausted through said exhaust port, and thereafter said mixed gas introduced through said mixed gas inlet port is caused to form a plasma discharge and supplied to the substrate while exhausted through said exhaust port.

15. The substrate processing apparatus of claim 13, wherein
said controller performs control so that said mixed gasis caused to form a plasma discharge and supplied to the substrate while exhausted through said exhaust port, and thereafter said hydrogen gasis caused to form a plasma discharge and supplied to the substrate while exhausted through said exhaust port.

* * * * *